United States Patent [19]

Yokosawa

[11] Patent Number: 5,528,182
[45] Date of Patent: Jun. 18, 1996

[54] POWER-ON SIGNAL GENERATING CIRCUIT OPERATING WITH LOW-DISSIPATION CURRENT

[75] Inventor: Kouji Yokosawa, Kanagawa, Japan

[73] Assignee: NEC Corporation, Japan

[21] Appl. No.: 281,366

[22] Filed: Jul. 27, 1994

[30] Foreign Application Priority Data

Aug. 2, 1993 [JP] Japan .................... 5-191061

[51] Int. Cl.⁶ .................... H03K 3/01; H03K 5/153
[52] U.S. Cl. .................... 327/143; 327/198
[58] Field of Search .................... 327/142, 143, 327/198, 538, 544, 545, 546

[56] References Cited

U.S. PATENT DOCUMENTS

| | | | |
|---|---|---|---|
| 4,697,097 | 9/1987 | Rusznyak | 307/296 |
| 4,698,531 | 10/1987 | Jones | 307/592 |
| 4,748,352 | 5/1988 | Kamiya et al. | 307/592 |
| 5,155,384 | 10/1992 | Ruetz | 327/143 |
| 5,243,231 | 9/1993 | Baik | 307/296.3 |

FOREIGN PATENT DOCUMENTS

| | | |
|---|---|---|
| 3-236624 | 10/1991 | Japan . |
| 3-249817 | 11/1991 | Japan . |
| 3284122 | 12/1991 | Japan . |

*Primary Examiner*—Timothy P. Callahan
*Assistant Examiner*—Eunja Shin
*Attorney, Agent, or Firm*—Ostrolenk, Faber, Gerb & Soffen

[57] ABSTRACT

A P-channel field effect transistor (FET) T5 is connected between a constant current circuit constituted by first and second P-channel FETs T1 and T2 and first and second N-channel FETs T6 and T7, and a resistor, and a voltage detecting circuit. A gate of the FET T5 is connected to an output of the voltage detecting circuit, a drain of which is connected to the gates of the FETs T6 and T7, and a source of which is connected to a power supply. The FET T5 operates so as to quickly start the constant current circuit when powered.

7 Claims, 6 Drawing Sheets

POWER-ON SIGNAL GENERATING CIRCUIT OPERATING WITH LOW-DISSIPATION CURRENT

BACKGROUND OF THE INVENTION

1. Field of the Invention

The present invention relates to a power-on signal generating circuit, and more particularly to a power-on signal generating circuit operating with a low-dissipation current.

2. Related Art

In a digital IC (Integrated Circuit), there may be a case that an internal portion of the IC must be initialized when it is powered. For this reason, a power-on signal generating circuit is built in the IC for generating a signal for the initialization when the IC is powered. A conventional power-on circuit is shown in FIG. 1.

In the circuit shown in FIG. 1, the power-on signal generating circuit includes: a power supply terminal 1; a P-channel type field effect transistor (FET) T11 a source of which is connected to the power supply terminal 1; a resistor R3 one terminal of which is connected to the power supply terminal 1; and a capacitor C4 one terminal of which is connected to the power supply terminal 1. A gate and a drain of the P-channel FET 11, one terminal of a resistor R2, one terminal of a capacitor C3, and a gate of an N-channel FET T12 are mutually connected to a node Nd. The other terminal of the resistor R3, a drain of the N-channel FET T12, the other terminal of a capacitor C4, an input of an inverter B3 are mutually connected to a node Ne. An output of the inverter B3 is connected to an output terminal. The other terminal of the resistor R2, the other terminal of the capacitor C3, and a source of the N-channel FET T12 are connected to a ground terminal 2.

FIG. 2 is a characteristic diagram showing a relation between an output voltage of the power-on signal generating circuit shown in FIG. 1 with respect to time.

More specifically, FIG. 2 shows a relation among a potential V1 of the power supply terminal 1, a potential of the node Nd, a potential of the node Ne, and a potential of the output terminal 3 when the circuit is powered. The potential V1 of the power supply terminal 1 raises in accordance with elapse of time and exceeds a threshold voltage Vtp of the P-channel FET T11 in the neighbor of the time t4. The potential of the node Nd raises in accordance with the elapse of time while retaining a value of (V1−Vtp) from approximately time t4. In the neighborhood of time t5, the potential of the node Nd exceeds a threshold voltage of the N-channel FET T12, and thus the N-channel FET T12 is conducted. As a result, a potential of the node Ne changes from the potential V1 of the power supply terminal 1 to the potential of the ground terminal 2. For this reason, the output of the inverter B3 is inverted at time t6 where the curve of the potential of the node Ne crosses with the logical threshold voltage of the inverter B3. More specifically, the potential of the output terminal 3 becomes the ground potential (0 V) during a period of t0 through t6, and becomes the potential V1 of the power supply terminal 1 after the time t6. Accordingly, when the circuit is powered, the potential of the output terminal 3 becomes at "Low" level during a period of time t0 through t6, and changes at "High" level after the time t6. The period in which the signal which is output from the output terminal 3 and at the "Low" level is used as the power-on signal.

The current dissipated in the power-on signal generating circuit is a sum of currents IR2 and IR3 flowing through the resistor R2 and R3.

The current IR2 is expressed as the equation (1):

$$IR2 = Vd/r2 \qquad (1)$$

wherein Vd is a potential of the node Nd and r2 is a resistance value of the resistor R2.

If an ON-resistance of the FET T11 is small enough with respect to the resistor R2, the above equation (1) can be expressed as the equation (1').

$$IR2 = (V1 - |Vtp|)/r2 \qquad (1')$$

wherein V1 is a potential of the power supply terminal 1, and Vtp is a threshold voltage of the P-channel FET T11.

If an ON-resistance of the N-channel FET T12 is small enough with respect to the resistor R3, the current IR3 can be expressed by the following equation (2).

$$IR3 \approx V1/r3 \qquad (2)$$

wherein r3 is a resistance of the resistor R3.

The dissipation current IA of the power-on signal generating circuit shown in FIG. 1 can be expressed by the equation (3).

$$IA = IR2 + IR3 = \{(V1-|Vtp|)/r2\} + (V1/r3) \qquad (3)$$

Accordingly, as is apparent from the above equation (3), the dissipation current increases in proportion with the increase of the power supply voltage V1. Therefore, the resistance value must be increased in order to decrease the dissipation current. However, if the resistance value is increased, there is a drawback that the area is increased when the power-on signal generating circuit is implemented with an integrated circuit.

SUMMARY OF THE INVENTION

Accordingly, an object of the present invention is to provide a power-on signal generating circuit with small dissipation current and a small occupation area in an integrated circuit.

In order to achieve the above object, a power-on signal generating circuit according to the present invention comprises: a constant current circuit (4) comprising a first FET (T1) of a first conductivity type a source of which receives a first power supply voltage; a second FET (T2) of the first conductivity type a source of which receives the first power supply voltage and a gate of which is coupled to a gate of the first FET; a third FET (T6) of a second conductivity type a drain of which is coupled to a drain and the gate of the first FET; a resistor (R1) one terminal of which is coupled to a source of the third FET and the other terminal of which receives a second power supply voltage; a fourth FET (T7) a drain and a gate of which are coupled to the drain of the second FET, and a source of which receives the second power supply voltage; starting means, coupled to one of the drain of the first FET and the drain of the second FET, for quickening an operation start timing of said constant current circuit; and a power-on signal output means (5) for outputting a power-on signal in response to a voltage of the drain of the first FET and a voltage of the drain of the second FET.

According to the present invention, a power-on signal generating circuit with a low-dissipation current can be realized by a constant current circuit, a field effect transistor for quickly starting the constant current circuit and a voltage detecting circuit. Further, the resistance value can be reduced so that the area of the integrated circuit can be reduced.

DETAILED DESCRIPTION OF THE PREFERRED EMBODIMENTS

Figure 1:
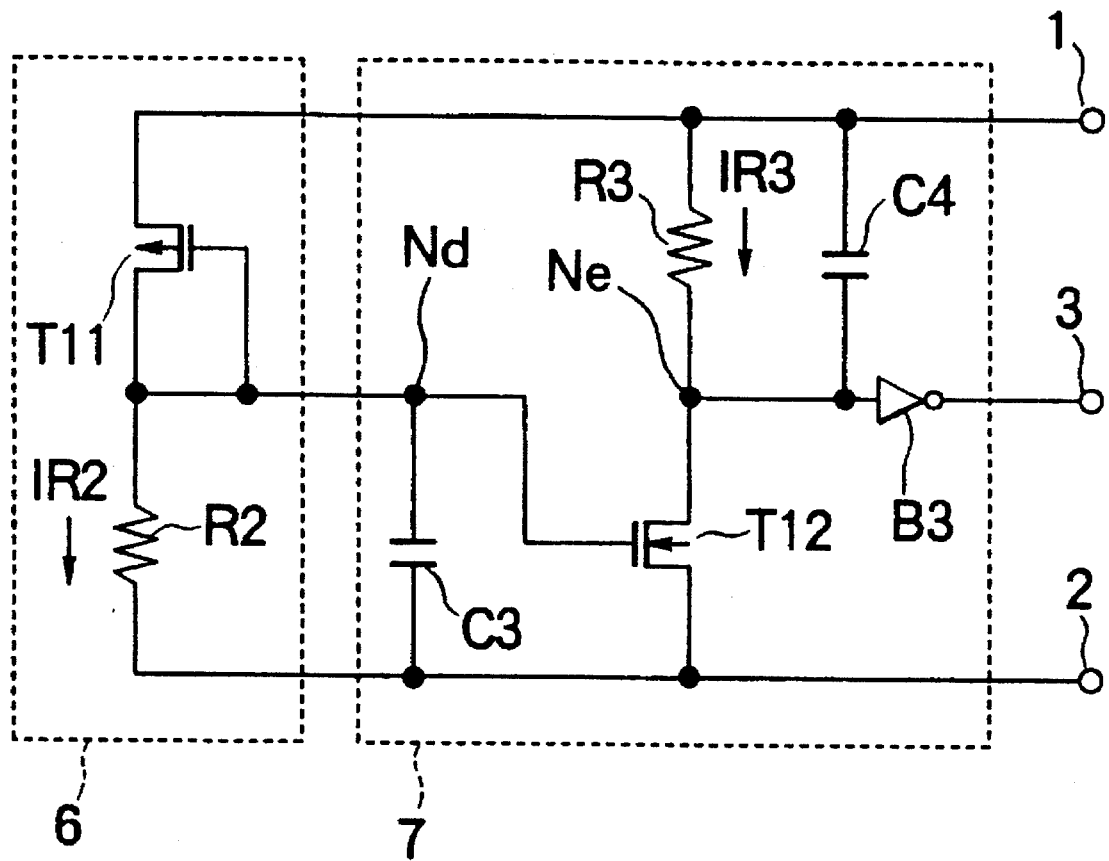
FIG. 1 is a circuit diagram showing a conventional power-on signal generating circuit.
Figure 2:
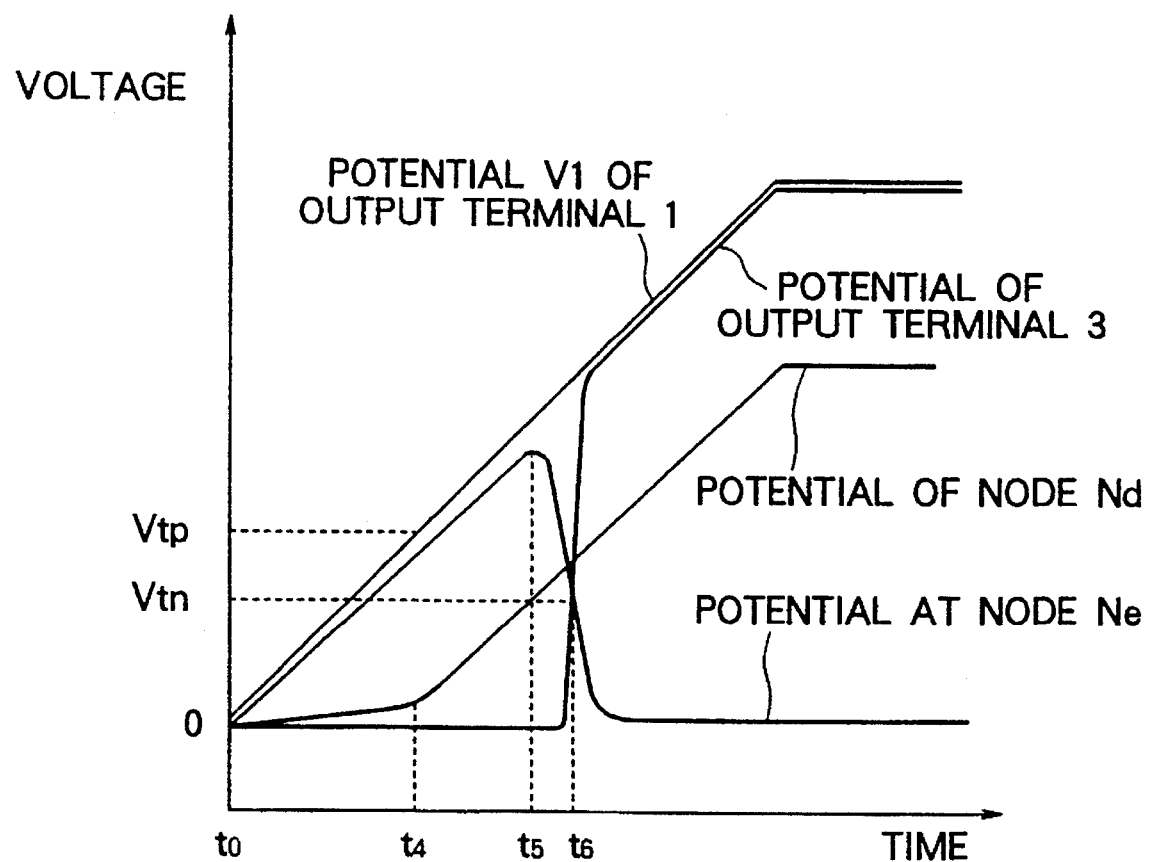
FIG. 2 is a characteristic diagram showing a voltage change at each portion of the conventional power-on signal generating circuit shown in FIG. 1.

A power-on signal of a first embodiment according to the present invention will now be described with reference to the circuit shown in FIG. 3. In the circuit shown in FIG. 3, to a power supply terminal 1 (a first power supply) to which a power supply voltage V1 is applied, connected are a source of a first field effect transistor (FET) T1 of a P channel type (a first conductivity type), a source of second FET T2 of the P channel type, a source of a third FET T3 of the P channel type, a source of a fourth FET T5 of the P channel type, a source of a fifth FET of the P channel type, and one terminal of a first capacitor C1. A gate and a drain of the first FET T1, gates of the second and third FETs T2 and T3, and a drain of a sixth FET of an N channel type (a second conductivity type) are connected to a node Na. A source of the sixth FET T6 is connected to one terminal of the resistor R1. To a ground terminal (a second power supply) connected are the other terminal of the resistor R1, a source of an N-channel type seventh FET T7, a source of an N-channel type FET T8, a source of an N-channel type FET T9, and one terminal of a second capacitor C2. Each gate of the sixth and ninth FETs T6 and T9, a gate and a drain of the seventh FET T7, and each drain of the second and fifth FETs T2 and T5 are connected to a node Nb. A gate and a drain of the eighth transistor T8, a drain of the third FET T3, a gate of the fourth FET T4, and the other terminal of the first capacitor C1 are connected to a node Nb'. Furthermore, a drain of the fourth FET T4, a gate of the fifth FET T5, a drain of the ninth FET T9, and the other terminal of the second capacitor C2 are connected to a node Nc. An output of the output buffer is connected to an output terminal 3.

The P-channel type FETS T1, T2, the N-channel type FETS T6 and T7, and the resistor R1 constitute a constant current circuit 4. Further, the P-channel type FETs T3 and T4, the N-channel type FETs, T8 and T9, the capacitors C1 and C2, and the output buffer B1 constitute a voltage detecting circuit 5. The P-channel type FET T5 is connected between the constant current circuit 4 and the voltage detecting circuit 5 in order to start the operation of the constant current circuit 4 earlier.

A value of a current flowing through the constant current circuit 4 is determined in accordance with a size ratio of the P-channel FETs T1 and T2, size ratio of the N-channel FETs T6 and T7, and a resistance of the resistor R1. Accordingly, constant current I1 and I2 flowing into the P-channel type FETs T1 and T2 can be expressed by the following equations (4) and (5), respectively.

$$I2 = S2 \cdot I1/S1 \quad \ldots (4)$$

$$I1 = (K \cdot T/r \cdot q) \ln(S2 \cdot S6 \cdot S1 \cdot S7) \quad (5)$$

wherein K is a Boltzmann's constant, T is an absolute temperature, r is a resistance value of the resistor R1, q is a charge amount of an electron, S1 is a ratio of an effective channel width and an effective channel length of the P-channel FET T1 (Weff1/Lwff1), S2 is a ratio of an effective channel width and an effective channel length of the P-channel FET T2 (Weff2/Lwff2), S6 is a ratio of an effective channel width and an effective channel length of the N-channel FET T6 (Weff6/Leff6), and S7 is a ratio of an effective channel width and an effective channel length of the N-channel FET T7 (Weff7/Leff7). As is apparent from the equation (5), the constant currents flowing through the constant current circuit 4 are not dependent on the power supply voltage.

An operation of the voltage detecting circuit 5 shown in FIG. 3 will now be described.

A gate voltage of the FET T3 is equal to the gate voltage of the FET T1 in the constant current circuit 4. Accordingly, a current I3 flowing through the FET T3 can be expressed by the following equation (6).

$$I3 = S3 \cdot I1/S1 \quad (6)$$

wherein S3 is a ratio of an effective channel width and an effective channel length of the P-channel FET T3 (Weff3/Leff3).

A gate voltage of the FET T9 is equal to the gate voltage of the FET T7 in the constant current circuit 4. Accordingly, a current I4 flowing into the FET T9 can be expressed by the following equation (7).

$$I4 = S9 \cdot I2/S7 \quad (7)$$

wherein S9 is a ratio of an effective channel width and an effective channel length of the N-channel type FET T9 (Weff9/Leff9).

A current T3 flowing through the N-channel type FET T8 is proportional to the current I1 flowing through the constant current 4 as is apparent from the equations (5) and (6). If the current I3 is set at a low value, the gate voltage (a potential Vb' at the node Nb') of the N-channel FET T8 is close to a threshold voltage Vtn thereof. Accordingly, the gate voltage (potential Vb' at the node b') of the N-channel type FET T8 can be expressed by the equation (8)

$$Vb! \approx Vtn \quad (8)$$

Accordingly, a gate voltage Vgt4 of the P-channel FET T4 can be expressed by the equation (9) from the equation (8).

$$|Vgt4| = |V1 - Vtn| \quad (9)$$

wherein V1 is a potential of the power supply terminal 1.

A power supply driving capability It4 of the P-channel type FET T4 can be expressed by the following equation (19).

$$It4 = (\tfrac{1}{2})\beta t4(Vgt4 - |Vtp|)^2 \quad (10)$$

wherein βt4 is (Weff4/Leff4)·Kp, Kp is a conductive coefficient, and Vtp is a threshold voltage of the P-channel FET.

A potential Vc at the node Nc is determined in accordance with values of the current driving capability It4 of the P-channel FET T4 and the current driving capability I4 of the N-channel FET T9.

If It4<I4 ... (11), the potential Vc at the node Nc becomes at a low level, and if It4>I4 ... (12), the potential Vc at the node Nc becomes at a high level. In other words, when It4=I4, a voltage of the output terminal 3 is inverted. If I4 is set to a low value and βt4 in the equation (10) is set to be large enough, It4 becomes greater than I4 when |Vtg4|−|Vtp|>0 ... (14) is satisfied. Accordingly, a rough value of the power supply voltage V1 at which an output of the output terminal 3 is inverted can be expressed by the following equation (15) from the equations (9) and (14).

$$V1 \approx |CVtp| + Vtn \quad (15)$$

In order to perform the above operations stably, the constant current circuit 4 and the voltage detecting circuit 5 must be operated stable from the beginning of the power-on signal generating circuit being powered. However, the operation of the constant current circuit 4 when powered starts in which the potential Ia at the node Na is close to the potential of the power supply terminal 1 and the potential at the node Nb is close to the potential of the ground terminal (in other words, in a state that each FETs are turned off) due to a parasitic capacitance mainly derived from the gate capacitances of each FET. For this reason, it takes a longer time for the constant current circuit 4 to become a stable operation state. According to the present invention, the P-channel FET T5 a gate of which receives the potential at the node Nc is inserted between the power supply terminal 1 and the node Nb. As a result, the potential at the node Nb is close to the potential of the power supply terminal 1. Accordingly, the FET T5 can reduce the time required for the constant current circuit 4 becomes the stable operation state. In other words, the FET T5 can start the constant current circuit 4 quickly.

The embodiment shown in FIG. 3 will now be described with reference to a characteristic showing a relation between a voltage and time shown in FIG. 4.

Figure 4:
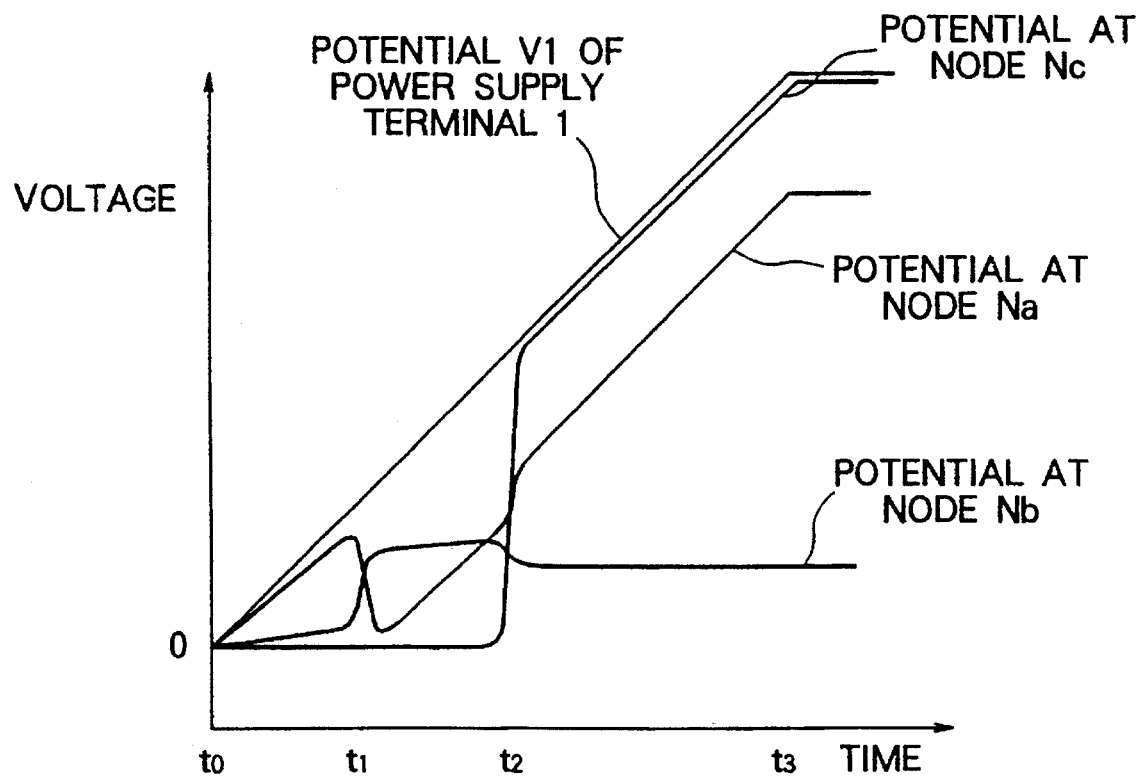
FIG. 4 is a characteristic diagram showing a voltage change at each portion of the power-on signal generating circuit shown in FIG. 3.

Assume now that the power supply is turned on at t0 shown in FIG. 4, and the voltage at the power supply terminal 1 becomes a predetermined value and a stable state at t3. During the period from t0 to t1, the power supply voltage is at a low level so that all the FETs are turned off. Accordingly, the potential Vb' at the node Nb' becomes a potential close to the power supply voltage due to the capacitor C1, and the potential Vc at the node Nc becomes a potential close to a ground voltage due to the capacitor C2. The potentials Va and Vb at the nodes Na and Nb become the potentials close to the power supply voltage and the ground voltage, respectively due to the parasitic capacitance which is mainly derived from the gate capacitances of each FETs.

During a period of t1 to t2, the potential V1 at the power supply terminal becomes the threshold voltage Vtp or more of the P-channel FET T5. As a result, the P-channel FET T5 is turned on so that the potential Vb at the node Nb is raised. When the potential Vb is raised, the gate voltage of the N-channel FET T6 is raised so that the potential Va at the node Na is reduced to the potential at the ground terminal. As a result, the constant current circuit 4 starts its operation.

If the current driving capability of the P-channel FET T5 is set to be smaller than that of the N-channel FET T7, the potential Vb at the node Nb is not raised to such a level that it exceeds the potential at the power supply terminal. Accordingly, the influence on the characteristic of the constant current circuit 4 given by the current driving capability of the P-channel FET T5 is small.

After t2, the potential V1 at the power supply terminal is raised and the equation (14) is satisfied. As a result, the potential Vc at the node Nc become at a "HIGH" level. In other words, the potential Vc at the node Nc is at a "LOW" level during a period of time t0 to t2, and becomes at a "HIGH" level after t2. The change of potential Vc at the node Nc is output to the output terminal 3 through the output buffer B1. The output signal whose potential Vc is at the "LOW" level is used as the power-on signal. Further, since the potential Vc becomes at the "HIGH" level, the P-channel FET T5 is turned off so that the constant current 4 exhibits a state expressed by the equations (4) and (5).

A simple design example will now be described by using the conventional circuit shown in FIG. 1 and the circuit of the first embodiment of the present invention shown in FIG. 3.

Assume now that |Vtp|=Vtn=1 (V), the power supply voltage V1=5 (V), and the dissipation current is 1 (μA) or less.

The dissipation current IA flowing into the conventional circuit shown in FIG. 1 is expressed by the equations (16) from the equation (3).

$$\begin{aligned} IA &= IR2 + IR3 \\ &= \{(V1 - |Vtp|)/r2\} + (V1/r3) \\ &= 4(V)/r2 + 5(V)/r3 \end{aligned} \quad (16)$$

If the dissipation current=1 (μA) is realized with the condition of IR2=IR3, r2=8 (MΩ) and r3=10 (MΩ), resulting in a large resistance value.

Figure 3:
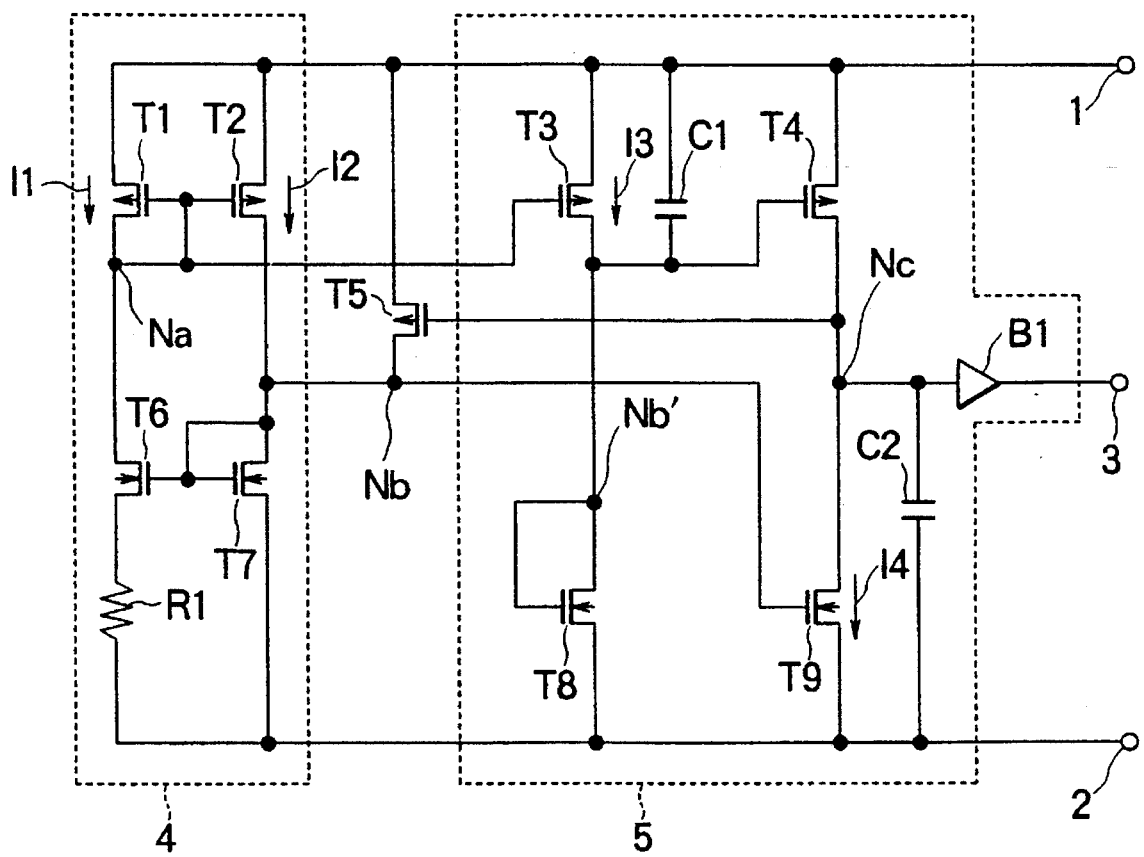
FIG. 3 is a circuit diagram of a power-on signal generation circuit of a first embodiment according to the present invention.

On the other hand, the dissipation current IB flowing into the circuit of the embodiment shown in FIG. 3 is determined by the constant current obtained by the constant current circuit and the current flowing into the current mirror circuit. Accordingly, the equation (17) is satisfied.

$$IB = I1 + I2 + I3 + I4 \quad (17)$$

If the circuit parameters are set such that the resistance r of the resistor R1 is 1 (MΩ), S1=S2=S3, S7=S9, S6=5×S7, KT/q=0.026 (V), S2·S6/(S1·S7)=5, I1 can be expressed by the equation (18) from the equation (5).

$$\begin{aligned} I1 &= (K \cdot T/(r \cdot q)) \cdot \ln(S2 \cdot S6/(S1 \cdot S7)) \\ &= 1/1 \, (M\Omega) \cdot 0.026 \cdot \ln 5 \\ &\approx 42 \, (nA) \end{aligned} \quad (18)$$

Further, since S1=S2=S3 and S7=S9, the following equation (19) is obtained.

$$I1 = I2 = I3 = I4 \quad (19)$$

Accordingly, the following equation (20) is obtained from the equations (17), (18), and (19).

$$IB = 42(nA) \times 4 = 168(nA) \quad (20)$$

As is apparent from the above equation, not only the dissipation current but also the resistance value can be reduced.

As described above, according to the present invention, the low dissipation current can easily be implemented compared to the conventional circuit. Further, the resistance value can also be reduced so that the area of the integrated circuit can be reduced.

Figure 5:
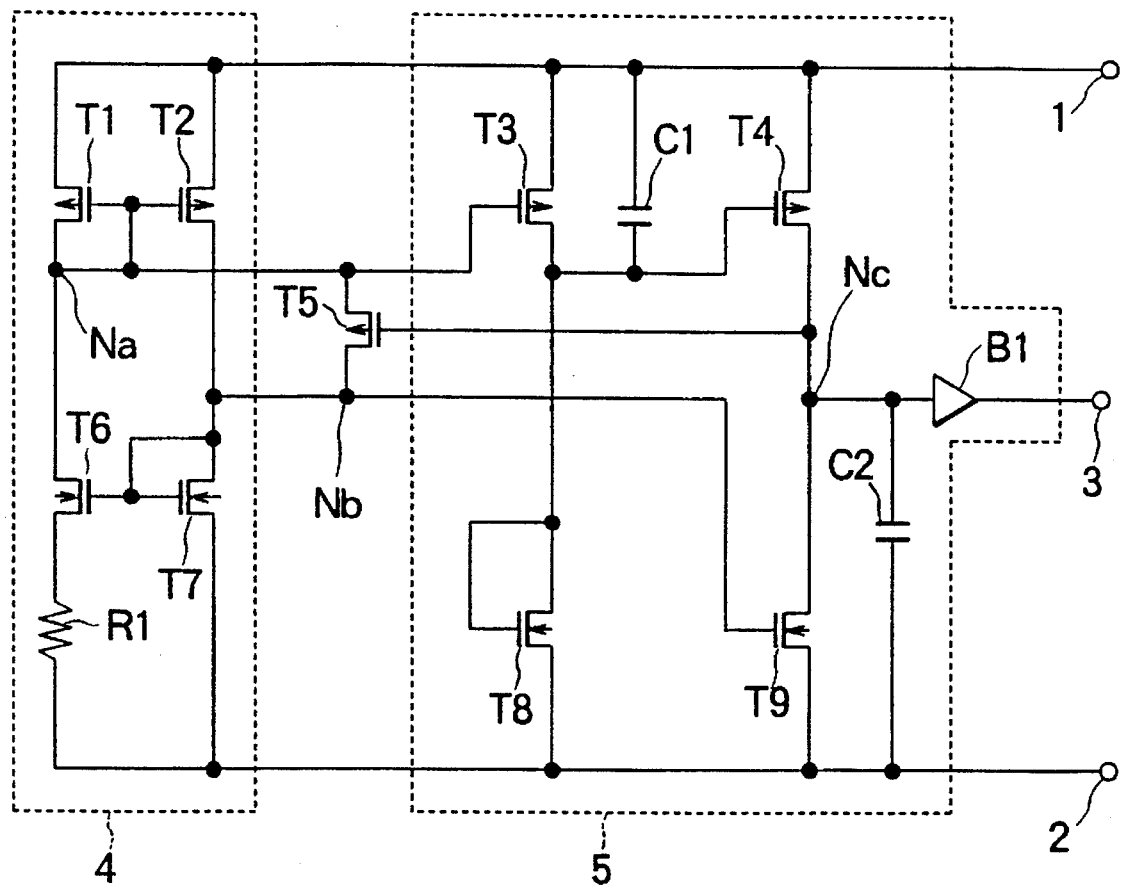
FIG. 5 is a circuit diagram of a power-on signal generating circuit of a second embodiment according to the present invention.

FIG. 5 shows a second embodiment of the power-on signal generating circuit according to the present invention.

In the first embodiment shown in FIG. 3, the source of the P-channel FET T5 is connected to the power supply terminal 1. The same effect can also be obtained by connecting the source of the P-channel FET T5 to the node Na as is shown in FIG. 5. More specifically, the power-on signal generating circuit in the second embodiment shown in FIG. 5 is characterized in that the source of the FET T5, and each gate of the first, second, third, and sixth FETs T1, T2, T3 and T6 in the first embodiment are commonly connected to the node Na.

Note that the arrangement of the second embodiment is same as that of the first embodiment except the connection of the source of the FET T5, and thus the description thereof will be omitted.

Figure 6:
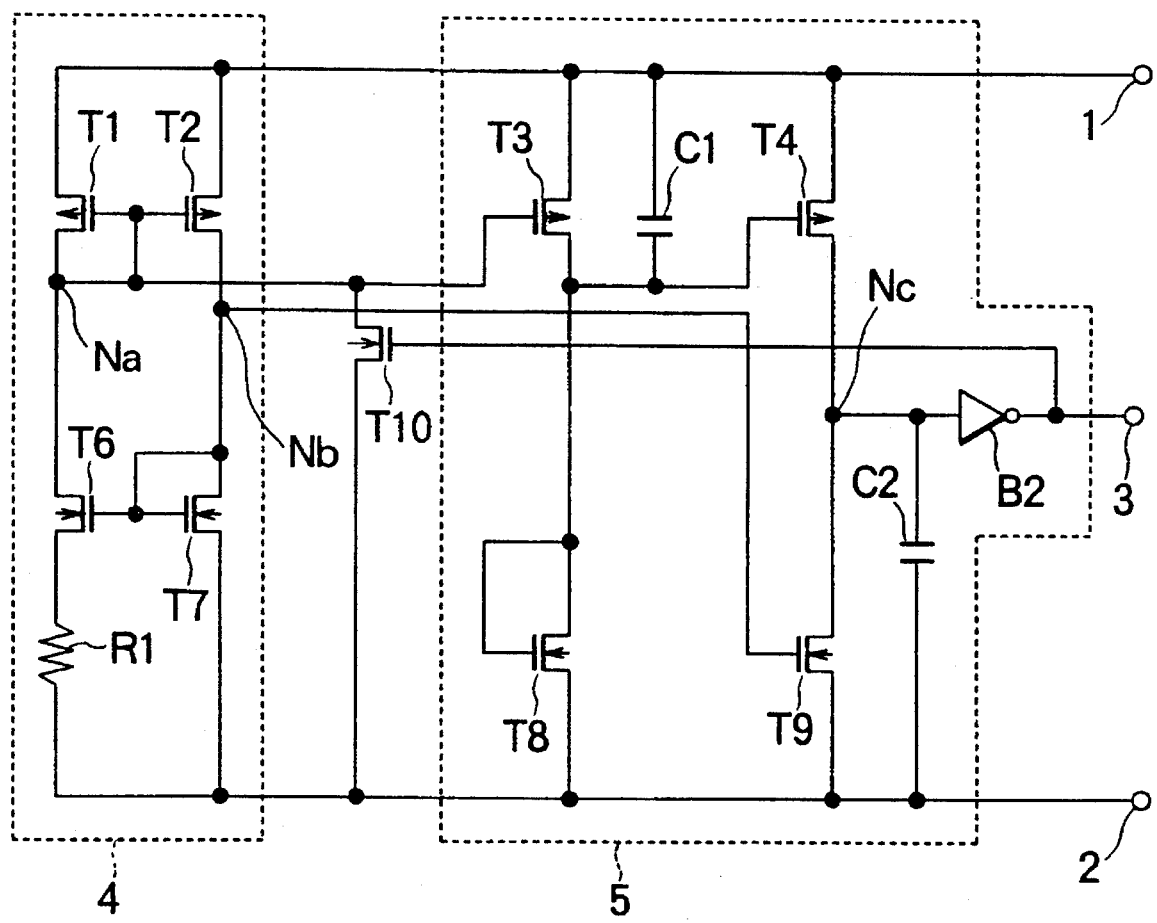
FIG. 6 is a circuit diagram of a power-on signal generating circuit of a third embodiment according to the present invention.

FIG. 6 is a circuit diagram showing a third embodiment of the power-on signal generating circuit of the present invention. In the third embodiment, an N-channel FET T10 is provided in place of the P-channel FET T5. More specifically, a drain of the N-channel FET T10 is connected to the node Na, a gate of which is connected to the output terminal 3, and a source of which is connected to the ground terminal 2. Furthermore, an inverter B2 in place of the buffer B1 is connected to the output terminal 3. The signal at the node Nc is inverted by the inverter B2 and input to the gate of the FET T10. This arrangement can also achieve the same effect as in the first embodiment.

In other words, the power-on signal generating circuit shown in the third embodiment is characterized in that the N-channel FET T10 is used in place of the P-channel FET T5, the drain of FET T10 and each gate of the first, second, third, and sixth FETs T1, T2, T3, and T6 are commonly connected to the node Na, the source of the FET T10 is connected to the ground terminal (second power supply), the gate of the FET T10 is connected to the output terminal 3, and the inverter B2 is used in place of the buffer B1.

The present invention is not limited to the above embodiments and various embodiments, and modifications are possible without departing the scope of the present invention recited in the claims.

What is claimed is:

1. A power-on signal generating circuit, comprising:

first through fifth field effect transistors (FETs) of a first conductivity type;

sixth through ninth FETs of a second conductivity type;

first and second capacitors;

an output buffer;

a resistor; and an output terminal;

each source of said first through fifth FETs and one terminal of the first capacitor being connected to a first power supply;

a gate and a drain of said first FET, each gate of said second and third FETs, and a drain of said sixth FET being commonly connected;

a source of said sixth FET being connected to one terminal of said resistor;

the other terminal of said resistor, each source of said seventh through ninth FETs, and one terminal of said second capacitor being connected to a second power supply;

gates of said sixth and ninth FETs, a gate and a drain of said seventh FET, and drains of said second and fifth FETs being commonly connected;

a gate and a drain of said eighth FET, a drain of said third FET, a gate of said fourth FET, and the other terminal of said first capacitor being commonly connected;

a drain of said fourth FET, a gate of said fifth FET, a drain of said ninth FET, the other terminal of said second capacitor, and an input terminal of said output buffer being commonly connected;

output terminal of said output buffer being connected to said output terminal of the power-on signal generating circuit;

said first, second, sixth and seventh FETs, and the resistor constitute a constant current circuit; and said third, fourth, eighth and ninth FETs, said first and second capacitors, and said output buffer constitute a voltage detecting circuit.

2. The circuit according to claim 1, wherein the first and second conductivity types are P-channel and N-channel, respectively, and the first and second power supplies are a power supply potential and a ground potential, respectively.

3. A power-on signal generating circuit, comprising:

first through fifth field effect transistors (FETs) of a first conductivity type;

sixth through ninth FETs of a second conductivity type;

first and second capacitors;

an output buffer;

a resistor; and an output terminal;

each source of said first through fourth FETs, and one terminal of said first capacitor being connected to a first power supply;

a gate and a drain of said first FET, gates of said second and third FETs, a source of said fifth FET, and a drain of said sixth FET being commonly connected;

a source of said sixth FET being connected to one terminal of said resistor;

the other terminal of said resistor, each source of said seventh through ninth FETs, and one terminal of said second capacitor being connected to a second power supply;

each gate of said sixth and ninth FETs, a gate and a drain of said seventh FET, and drains of said second and fifth FETs being commonly connected;

a gate and a drain of said eighth FET, a drain of said third FET, a gate of said fourth FET, and the other terminal of said first capacitor being commonly connected;

a drain of said fourth FET, a gate of said fifth FET, a drain of said ninth FET, the other terminal of said second capacitor, and an input terminal of said output buffer being commonly connected;

an output terminal of said output buffer being connected to an output terminal of the power-on signal generating circuit;

said first, second, sixth and seventh FETs, and said resistor constitute a constant current circuit; and said third, fourth, eighth and ninth FETs, said first and second capacitors, and said output buffer constitute a voltage detecting circuit.

4. The circuit according to claim 3, wherein the first and second conductivity types are P-channel and N-channel, respectively, and the first and second power supplies are a power supply potential and a ground potential, respectively.

5. A power-on signal generating circuit, comprising:

first through fourth field effect transistors (FETs) of a first conductivity type;

sixth through tenth FETs of a second conductivity type;

first and second capacitors;

an inverter;

a resistor;

an output terminal;

each source of said first through fourth FET, and one terminal of said first capacitor being connected to a first power supply;

a gate and a drain of said first FET, gates of said second and third FETs, a drain of said tenth FET, and a drain of said sixth FET being commonly connected;

a source of said sixth FET being connected to one terminal of said resistor;

the other terminal of said resistor, each source of said seventh through ninth FETs, a source of said tenth FET, and one terminal of said second capacitor being connected to a second power supply;

each gate of said sixth and ninth FETs, a gate and a drain of said seventh FET, and a drain of said second FET being commonly connected;

a gate and a drain of said eighth FET, a drain of said third FET, a gate of said fourth FET and the other terminal of said first capacitor being commonly connected;

a drain of said fourth FET, a drain of said ninth FET, the other terminal of said second capacitor, and an input terminal of said inverter being commonly connected;

an output terminal of said inverter being connected to a gate of said tenth FET and said output terminal of the power-on circuit;

said first, second, sixth and seventh FETs, and said resistor constitute a constant current circuit; and said third, fourth, eighth, and ninth FETs, said first and second capacitors, and said inverter constitute a voltage detecting circuit.

6. The circuit according to claim 5, wherein the first and second conductivity types are P-channel and N-channel, respectively, and the first and second power supplies are a power supply potential and a ground potential, respectively.

7. A power-on signal generating circuit, comprising:

a constant current circuit including:

a first FET of a first conductivity type, a source of which receives a first power supply voltage;

a second FET of the first conductivity type, a source of which receives the first power supply voltage and a gate of which is coupled to a gate of the first FET;

a third FET of a second conductivity type, a drain of which is coupled to a drain and the gate of the first FET;

a resistor having one terminal coupled to a source of the third FET and the other terminal of which receives a second power supply voltage; and a fourth FET, a drain and a gate of which are coupled to the drain of the second FET, and a source of which receives the second power supply voltage;

starting means, coupled to one of the drain of the first FET and the drain of the second FET, for increasing the start of operation of said constant current circuit by eliminating the influence of parasitic capacitance due to gate capacitances of FETs; and a power-on signal output means for outputting a power-on signal in response to a voltage of the drain of the first FET and a voltage of the drain of the second FET;

the starting means includes any one of:

an FET of a first conductivity type, a source of which receives the first power supply voltage, a drain of which is coupled to the drain of the second FET, and a gate of which receives a signal from said power-on signal output means substantially equal to the output signal of the power-on signal output means;

an FET of a first conductivity type, a source of which is coupled to the drain of the first FET, a drain of which is coupled to the drain of the second FET, and a gate of which receives a signal from said power-on signal output means substantially equal to the output signal of the power-on signal output means; and an FET of a second conductivity type, a source of which receives the second power supply voltage, a drain of which is coupled to the drain of the first FET, and a gate of which receives a signal from said power-on signal output means substantially equal to the output signal of the power-on signal output means.

* * * * *